(12) United States Patent
Schweiker et al.

(10) Patent No.: US 12,741,540 B2
(45) Date of Patent: Sep. 22, 2026

(54) APPARATUS AND METHOD FOR DETECTING AN ELECTRIC CURRENT FLOW THROUGH A DIODE, AND ELECTRIC DRIVE SYSTEM

(71) Applicant: Robert Bosch GmbH, Stuttgart (DE)

(72) Inventors: Daniel Schweiker, Ludwigsburg (DE); Ekard Grossmann, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 19/121,915

(22) PCT Filed: Aug. 30, 2023

(86) PCT No.: PCT/EP2023/073817

§ 371 (c)(1),
(2) Date: Apr. 17, 2025

(87) PCT Pub. No.: WO2024/083391

PCT Pub. Date: Apr. 25, 2024

(65) Prior Publication Data

US 2026/0152071 A1 Jun. 4, 2026

(30) Foreign Application Priority Data

Oct. 20, 2022 (DE) ..................... 10 2022 211 110.9

(51) Int. Cl.

| | |
|---|---|
| ***B60L 3/00*** | (2019.01) |
| ***G01R 19/165*** | (2006.01) |
| ***G01R 19/25*** | (2006.01) |
| ***H02M 1/00*** | (2007.01) |
| ***H02M 7/5387*** | (2007.01) |

(52) U.S. Cl.
CPC ........ *B60L 3/003* (2013.01); *G01R 19/16547* (2013.01); *G01R 19/2513* (2013.01); *H02M 1/0009* (2021.05); *H02M 7/5387* (2013.01); *B60L 2210/42* (2013.01)

(58) Field of Classification Search
CPC ................. B60L 3/003; B60L 2210/42; G01R 19/16547; G01R 19/2513; H02M 1/0009; H02M 7/5387
See application file for complete search history.

(56) References Cited

U.S. PATENT DOCUMENTS 9,276,497 B2 * 3/2016 Mehringer .............. H02M 1/38
10,236,676 B2 * 3/2019 Goetting ................ H02H 3/083
(Continued)

FOREIGN PATENT DOCUMENTS

DE 102014222256 A1 5/2016

OTHER PUBLICATIONS

Translation of International Search Report for Application No. PCT/EP2023/073817 dated Dec. 5, 2023 (2 pages).

*Primary Examiner* — Menatoallah Youssef
*Assistant Examiner* — Michael J Warmflash
(74) *Attorney, Agent, or Firm* — Michael Best & Friedrich LLP

(57) ABSTRACT

Detection of an electric current through a diode arranged parallel to a semiconductor switching element. For this purpose, an output signal of a circuit arrangement for saturation monitoring (desat circuit) is used. The output signal is evaluated at periods in which the semiconductor switching element is opened.

12 Claims, 2 Drawing Sheets

(56) References Cited

U.S. PATENT DOCUMENTS

| | | | | |
|---|---|---|---|---|
| 2013/0307461 | A1* | 11/2013 | Mehringer | H02M 7/219<br>318/722 |
| 2014/0233278 | A1* | 8/2014 | Li | H02M 7/53873<br>363/37 |
| 2017/0310244 | A1* | 10/2017 | Goetting | H02M 7/53875 |
| 2023/0246570 | A1* | 8/2023 | Eberlein | H02H 7/08<br>323/268 |

* cited by examiner

APPARATUS AND METHOD FOR DETECTING AN ELECTRIC CURRENT FLOW THROUGH A DIODE, AND ELECTRIC DRIVE SYSTEM

BACKGROUND

The present invention relates to an apparatus and a method for detecting an electric current flow through a diode. In particular, the present invention relates to the detection of an electric current flow through a diode that is arranged parallel to a semiconductor switching element in a half-bridge of an electric power converter. The present invention further relates to an electric drive system having such an apparatus for detecting the current flow through a diode.

Electric drive systems are used in numerous applications. Such electric drive systems are used, for example, in fully or at least semi-electrically driven vehicles. Electrical energy from a power source, for example the traction battery of an electric vehicle, can be converted by means of a inverter into an electric voltage, which is suitable for driving an electric machine. In addition, so-called safe operating states can also be set in the inverter, for example an active short-circuit in which the switching elements are controlled such that the terminals of the electric machine are short-circuited. Furthermore, a so-called freewheel can be provided, in which all switching elements in the half-bridges of the inverter are opened.

For example, publication DE 10 2014 222 256 A1 describes a method for switching an operating state of an electric machine from a freewheel into an active short circuit. Here, it is proposed that in a multi-phase electric machine, the individual phases are successively shifted into the corresponding switching states.

SUMMARY

The present invention creates an apparatus and a method for detecting an electric current flow through a diode as well as an electrical drive system having the features of the independent claims. Further advantageous embodiments are the subject-matter of the dependent claims.

The following is provided:

An apparatus for detecting an electric current flow through a diode, wherein the diode is arranged parallel to a semiconductor switching element of a half-bridge. In particular, this can be a half-bridge in an electric power converter. The apparatus comprises a circuit arrangement for saturation monitoring and a detection device. The circuit arrangement for saturation monitoring of the semiconductor switching element is configured so as to detect an electrical voltage across the semiconductor switching element. Thus, this circuit arrangement also detects the electrical voltage across the diode arranged parallel to the semiconductor switching element. Furthermore, the circuit arrangement is configured so as to provide an output signal corresponding to the detected voltage. The detection device is configured so as to detect an electric current through the diode using the output signal from the circuit arrangement for saturation monitoring. In particular, the detection device can detect an electric current through the diode according to the output signal when the semiconductor switching element of the half-bridge arranged parallel to the diode is opened.

The following is furthermore provided:

An electrical drive system having an electric machine and a power converter. The power converter is electrically coupled to the electric machine. In particular, the power converter comprises at least one half-bridge. Preferably, the power converter can comprise a half-bridge for each phase of the electric machine. Each of the half-bridges comprises two semiconductor switching elements having a diode arranged parallel to the respective semiconductor switching element. The power converter is configured so as to control the electric machine using a DC voltage supplied to the power converter. Furthermore, for each semiconductor switching element, the power converter comprises an apparatus according to the invention for detecting an electric current flow through a diode.

Finally, the following is provided:

A method for detecting an electric current flow through a diode. The diode is arranged parallel to a semiconductor switching element of a half-bridge. Alternatively, the diode can be an intrinsic body diode of the semiconductor switching element in a half-bridge. The method comprises a step of detecting an electrical voltage across the semiconductor switching element and the diode arranged parallel thereto by means of a circuit arrangement for saturation monitoring of the semiconductor switching element and providing an output signal corresponding to the detected voltage. Furthermore, the method comprises a step of detecting an electric current through the diode using the provided output signal when the semiconductor switching element of the half-bridge arranged parallel to the diode is opened.

Advantages of the Invention

In electric drive systems, where electric machines are controlled by means of a power converter, a freewheeling state can be set as a so-called safe operating state, in which all the switching elements in the half-bridges of the power converter are open. If the connected electric machine is in motion, an electrical voltage can be induced in the electric machine, which is applied to the phase terminals and thus also to the power converter. If this induced voltage exceeds a certain value, the body diodes integrated into the switching elements or additional diodes provided parallel to the switching elements can result in a current flow from the electric machine towards the power supply of the power converter. In that case, it can be necessary to set an active short circuit in the power converter instead of the freewheel. To this end, it may be necessary to detect the current flow through the diodes parallel to the switching elements in order to initiate the necessary switching measures.

To detect a current flow through a diode parallel to a switching element in the half-bridge of a power converter, the present invention makes use of the fact that a circuit arrangement for saturation monitoring of the semiconductor switching element, in particular for monitoring a desaturation, can be provided in the power converter for each semiconductor switching element. While the term "saturation monitoring" is generally used in the present description, it is to be understood that this also includes monitoring of desaturation, depending on the semiconductor technology used. Such a circuit arrangement is known as a desat circuit, for example. In conventional power converters, this circuit arrangement is preferably used in order to simulate an electrical voltage applied over the semiconductor circuit element during the actuation of a semiconductor circuit element. This can be used, for example, in order to detect an excessive voltage drop in the driven semiconductor switching element and to infer therefrom, if necessary, an aging or a malfunction of the semiconductor switching element or the half-bridge. The signal provided by such a circuit arrangement for saturation monitoring is thus evaluated in particular at time intervals during which the semiconductor switching element is activated, i.e. closed.

It is now an idea of the present invention to use such a circuit arrangement already provided in the power converter for saturation monitoring of a semiconductor switching element for a further purpose.

In particular, the signal from such a saturation monitoring can be used in order to detect an electric current flowing through the diode arranged parallel to the opened semiconductor switching element, for example, in case a sufficiently high electrical voltage is supplied by a connected electrical machine during periods in which the semiconductor switching element is opened, in order to set, for example, a freewheel in the power converter. In this case, the diode becomes conductive across the open switch, and the voltage across the open switch drops to the negative value of the diode's flow voltage. The output signal provided by the circuit arrangement thus also decreases and falls below a predetermined threshold. This can be considered an indication of current flow through the diode. Thus, the same circuit arrangement for saturation monitoring is used at different time intervals or switching states for several tasks.

In this way, it is possible to reliably detect a current flow through a diode arranged parallel to a switching element with very little effort. Additional current sensors or similar devices can be omitted here. This reduces hardware requirements and thus costs.

According to one embodiment, the detection device comprises a comparator. Such a comparator can be implemented, for example, using an operational amplifier or similar device. This comparator is configured so as to compare the output signal from the circuit arrangement for saturation monitoring to a predetermined reference voltage. In particular, the detection device is configured so as to detect an electric current through the diode if the comparator determines that the output signal from the circuit arrangement for saturation monitoring falls below the predetermined reference voltage.

According to a further embodiment, the circuit arrangement for saturation monitoring of the semiconductor switching element comprises an analog-to-digital converter. This analog-to-digital converter is configured so as to determine a digital value corresponding to a voltage value of the output signal from the circuit arrangement for saturation monitoring. Furthermore, the detection device is configured so as to detect an electric current through the diode using the determined digital value. In this way, the processing of the signal from the circuit arrangement for saturation monitoring can be performed in a digital circuit. For example, an application-specific integrated circuit can be used for this purpose.

According to one embodiment, the device for detecting current flow further comprises a monitoring device. This monitoring device is configured so as to perform monitoring of the semiconductor switching element using the output signal from the circuit arrangement for saturation monitoring when the semiconductor switching element is controlled in a conductive state. For example, such a monitoring device can check the proper functioning of the semiconductor switching element in the closed state. For instance, if an electrical voltage drops across a closed semiconductor switching element and its value exceeds a specified threshold, this can indicate a faulty or aged semiconductor switching element or a fault in the half-bridge.

According to one embodiment, the detection device and the monitoring means are implemented in a common integrated circuit. The output signal can be provided parallel by the circuit arrangement for saturation monitoring of the detection device and the monitoring device, for example. Depending on the operating mode, only the logic for detection has to be reversed. Alternatively, depending on the operating mode, the output signal can alternatively be provided to one of the two devices.

According to one alternative embodiment, the detection device is configured so as to detect an electric current through the diode in a first operating mode if a first predetermined threshold voltage is exceeded. Furthermore, in a second operating mode, the detection device is configured so as to monitor the semiconductor switch using the output signal from the circuit arrangement for saturation monitoring if the semiconductor switching element is actuated in a conductive state and a predetermined second threshold voltage is exceeded. In other words, both monitoring of the semiconductor switching element in the open state to detect current flow through the parallel diode and monitoring of the semiconductor switching element in the closed state are performed by the same components or assembly. Here, only the logic of detection is inverted. Furthermore, a third operating mode can be provided, in which the error response is initiated if a current flow through the diode has been detected during monitoring. Such an error response can include, for example, initiating an active short circuit.

According to one embodiment, the first threshold voltage for diode flow detection and the second threshold voltage for saturation detection are the same. This can reduce the required component expense. Likewise, in this case, the diode flow detection is triggered even before a diode flow develops, thus allowing for faster detection.

According to one alternative embodiment, the first threshold voltage for diode flow detection and the second threshold voltage for saturation detection can be different. This allows for an optimization of saturation behavior and diode flow voltage, respectively. This optimization can minimize false positive triggers.

According to one embodiment, the half-bridge with the switching elements and the diodes is a half-bridge in an electric power converter. The detection device can be configured so as to detect an electric current through the diode if, in the power converter with the half-bridge, an operating state is set in which both switching elements of the half-bridge are permanently opened. In particular, this operating state can be the operating state of a so-called freewheeling, in which the switching elements of all half-bridges of a power converter are open.

According to one embodiment of the electric drive system, the power converter of the drive system is configured so as to change from a switching state of freewheeling into an active short circuit if a current flow through a diode has been detected in one of the apparatuses for detecting an electric current flow. As a result, for example, an excessive braking torque of the electric machine can be avoided, which could occur if electrical energy were to flow from the electric machine through the diodes to a battery connected to the power converter input.

The above embodiments and further developments can be combined with one another in any desired manner insofar as advantageous. Additional embodiments, further developments, and implementations of the invention also include inventive feature combinations not described or explicitly specified hereinabove or hereinafter with respect to exemplary embodiments. The skilled person will in particular also add individual aspects as improvements or additions to the respective basic forms of the invention.

BRIEF DESCRIPTION OF THE DRAWINGS

Further features and advantages of the invention are explained hereinafter with reference to the drawings. Shown are.

DETAILED DESCRIPTION

Figure 1:
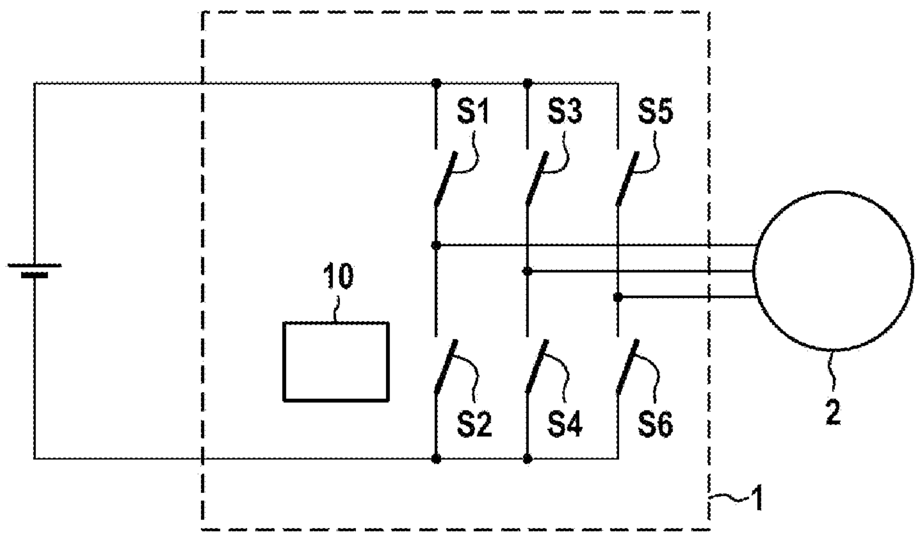
FIG. 1: a schematic representation of an electric drive system having a power converter.

FIG. 1 shows a schematic representation of a simplified circuit diagram for an electric drive system underlying one embodiment. The electric drive system comprises an electric power converter 1 and an electric machine 2. The phase terminals electric machine 2 are electrically coupled to an AC terminal of the power converter 1. A DC voltage source, such as a traction battery of an electric vehicle, can be connected to a DC terminal of the power converter 1. According to target value specifications, the power converter 1 can thus generate an AC voltage from the DC voltage supplied on the input side, which is suitable for driving the electric machine 2. Furthermore, it is also possible for the electric machine 2 to provide an electric AC voltage to the power converter 1 in a generator operation, wherein the AC voltage can be converted into a DC voltage by the power converter 1, which is suitable for recharging a battery connected to the DC terminal. The example with a three-phase electric machine 2 shown in FIG. 1 is merely an example and does not constitute a limitation of the present invention.

For each electrical phase of the electric machine 2, the power converter 1 comprises a half-bridge having two switching elements S1 to S6. Each half-bridge is formed from an upper switching element S1, S3, S5 as well as a lower switching element S2, S4, S6. The switching elements S1 to S6 can be controlled by means of a driving circuit 10.

In addition to an operating mode in which the switching elements S1 to S6 are controlled by means of the driving circuit 10 such that electrical energy is exchanged between the DC terminal and the electric machine, so-called safe operating states are also possible. Such a safe operating state is, for example, the freewheel. Here, all switching elements S1 to S6 are opened. Accordingly, no power is provided by the power converter 1 on the electric machine 2. However, if the electric machine 2 is in motion, an electric voltage in the electric machine 2 can be induced in a generator operation, which thus also applied on the corresponding terminals of the power converter 1. Furthermore, a so-called active short circuit is possible. In this case, either the upper switching elements S1, S3, and S5 or alternatively the lower switching elements S2, S4, S6 are closed. As a result, the phase terminals of the electric machine 2 are short-circuited.

Figure 2:
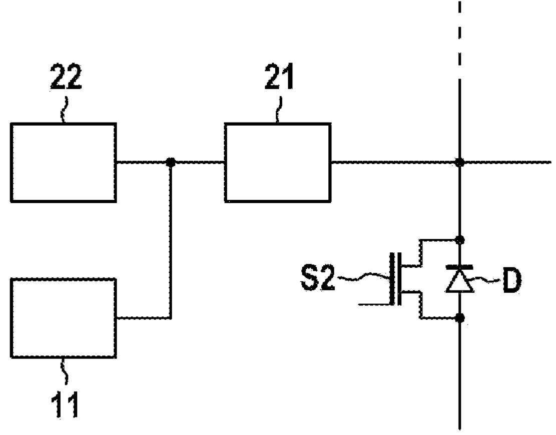
FIG. 2: a schematic representation of a half-bridge of a power converter according to one embodiment.

FIG. 2 shows a schematic representation of a switching element of a half-bridge, as it can be implemented, for example, in the power converter 1 described above. If a plurality of such half-bridges are provided in a power converter 1, they can be analogous in structure. In the following, the driving of a switching element S1 to S6 as well as the detection of an electric current by a diode D based on a lower switching element S2 is described. However, these embodiments also apply analogously to the further lower switching elements S4 and S6 as well as to the upper switching elements S1, S3, and S5.

The semiconductor switching elements S1 to S6 can be, for example, bipolar transistors comprising an isolated gate connection (IGBT) or MOSFET. In particular for IGBTs, a diode D can be arranged parallel to each semiconductor switch. In MOSFETs, especially in SiC-MOSFETs, this diode D can also be implemented by an intrinsic body diode.

To drive the switching element S2 (and analogously for driving the other switching elements S1, S3-S6), a driver circuit 11 can generate a control signal and provide it to a control terminal of the switching element S2. This driver circuit 11 can be implemented in the control device 10, for example.

To monitor the switching behavior of the switching element S2, a circuit arrangement 21 for saturation monitoring/desaturation monitoring can be provided. Such circuit arrangements 21 are also known as desat circuits or desaturation circuits, for example. Such a circuit arrangement 21 for saturation monitoring replicates the voltage currently applied across the switching element S2 at the input of the gate driver. The replicated voltage is limited to the amount of a supply voltage and thus does not increase to the full voltage across the switching element S2. With such a circuit arrangement 21 for saturation monitoring, the voltage drop across the switching element S2 can be monitored when the switching element S2 is closed, for example. In particular, if a voltage drop that is above a specified threshold value is detected when the switching element S2 is driven, this can indicate restricted conductivity of the switching element S2 or too high a current through the semiconductor element. In this way, for example, an erroneous behavior of the semi-bridging can be detected.

This circuit arrangement 21 for saturation or desaturation monitoring can, according to the invention, also be used in order to detect an electric current through the diode D arranged parallel to the switching element S2 when the switching element S2 is opened. In particular, an electric current can thus also be detected by the diode D when a freewheel is set in the power converter 1, in which all switching elements S1 to S6 are open. Such an electric current through the diode D when freewheeling can be caused, for example, by a voltage induced in the electric machine 2 when the voltage induced in the electric machine 2 is so high that electrical energy from the electric machine 2 flows through the diode D to the DC terminal of the power converter 1.

In order to detect the above-mentioned current flow through the diode D, the output signal is provided by the circuit arrangement 21 for saturation monitoring of a detection device 22. This detection device 22 can compare the output signal from the circuit arrangement 21 to a specified reference value, for example. If the electrical voltage of the output signal from the circuit arrangement 21 falls below this reference value, this can be considered an indication of an electric current through the diode D.

For example, a comparator can be provided in the detection device 22, which compares the output signal from the circuit arrangement 21 to a specified reference value, in particular a reference voltage. This reference voltage can be provided in any way, for example by means of a resistance divider or the like.

Alternatively, it is also possible to convert the output signal from the circuit arrangement 21 into a digital signal by means of an analog-to-digital converter and to subsequently further process that digital signal. For example, a microcontroller system, application-specific integrated circuit, or similar device can be used.

As described above, the detection of the current flow through the diode D occurs when the switching element S2 is open, in particular during a freewheeling state. In this case, if the current flow through the diode D is detected, a corresponding measure can be initiated as needed in order to prevent or at least limit this current flow through the diode D. For example, an active short circuit can be set in the power converter 1 instead of freewheeling.

By using the circuit arrangement 21 for saturation monitoring as described above, current flow through the diode D can thus be detected without additional sensors, such as a current sensor or similar device.

Figure 3:
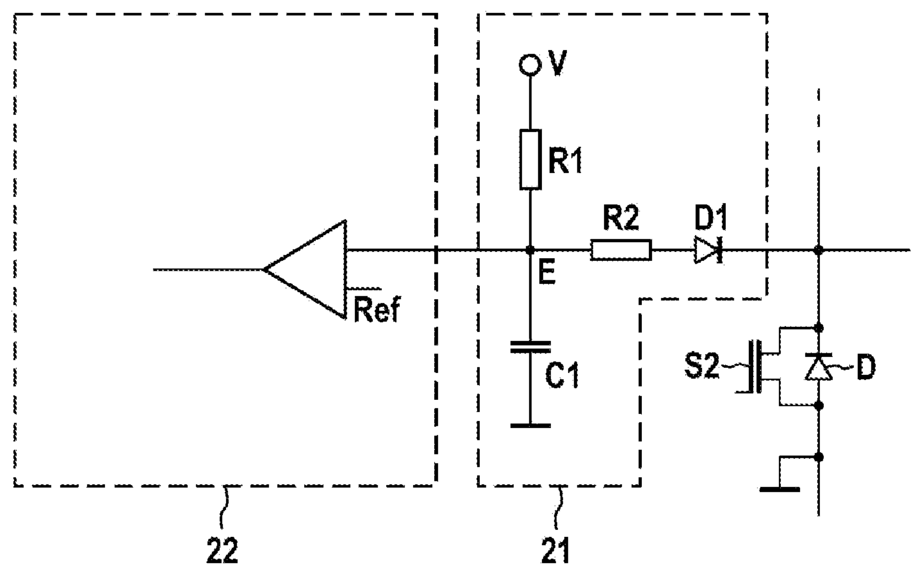
FIG. 3: a schematic representation of a simplified circuit diagram for detecting a current through a diode, according to one embodiment.

FIG. 3 shows a schematic diagram for monitoring a power converter 1 with an apparatus for detecting current flow through a diode D according to one embodiment. All of the embodiments already made in connection with FIG. 2 apply here.

As shown in FIG. 3, the circuit arrangement 21 for saturation monitoring can be implemented, for example, using a capacitor C1, a diode D1, and the two resistors R1 and R2. Here, for example, a first resistor R1 is arranged between a supply voltage V and a node E. The capacitor C1 is placed between the node E and a reference potential. Furthermore, a series circuit consisting of the second resistor R2 and a diode D1 is provided between the node E and an electrical connection to the phase terminal of the semiconductor switching element S2 to be monitored.

However, this illustrated embodiment of a circuit arrangement 21 for saturation monitoring serves only to illustrate the basic principle of such a circuit arrangement. It is understood that further adjustments, additions, or modifications may be made, depending on the specific application. For example, the circuit arrangement 21 can also be implemented by a resistance chain, wherein the capacitor C1 and the diode D1 are replaced by suitable electrical resistors.

At node E, there is thus an output signal available, which can be used in a conventional manner in order to monitor the switching behavior and the voltage drop across the switching element S2 when the switching element S2 is closed. In addition, the output signal present at node E can also be used in order to detect a current flow through the diode D, which is arranged parallel to the switching element S2. For this purpose, the output signal present at node E can be evaluated by the detection device 22 when the switching element S2 is open, in particular in a freewheeling state.

For example, the output signal of the circuit arrangement 21 at node E can be provided to an assembly, in particular an integrated circuit, in which a driver stage is provided for the switching element S2. On the one hand, when driving the switching element S2, this assembly can use the output signal from the circuit arrangement 21 to detect an excessive voltage drop across the switching element S2 when the switching element S2 is closed. Additionally, when the switching element S2 is open, this assembly can detect a current flow through the diode D.

For this purpose, two separate units can be provided in the above-mentioned assembly, for example a driver IC, wherein one unit forms the detection device 22 for detecting the current flow when the switching element S2 is open, and another unit forms a monitoring device for monitoring the voltage drop across the switching element S2 when the switching element S2 is closed. In this case, a lower trigger threshold can preferably be set for the detection of diode current. This avoids premature detection, which is associated with the trigger threshold of the monitoring device for monitoring the voltage drop when the switching element is closed.

Alternatively, it is also possible to implement the monitoring of the voltage drop with the switching element S2 closed and the detection of diode current using a single unit. For example, logic can be provided for this purpose, which switches between the two detection modes described above, depending on the application. For example, during normal operation to drive the electric machine 2, conventional monitoring of the voltage drop across a closed switching element S2 can be performed. If freewheeling is set in the power converter 1, the system can switch to an operating mode in which a diode flow through the diode D is detected. The trigger threshold, which must be fallen below for positive detection, can also be changed in order to select the threshold closer to the actual flow voltage of the diode.

Figure 4:
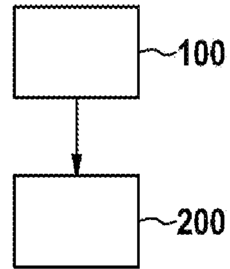
FIG. 4: a flow chart underlying a method for detecting a current through a diode according to one embodiment.

FIG. 4 shows a flowchart underlying a method for detecting an electrical current flow through a diode D according to one embodiment. The method can be used in particular for circuit arrangements having a semiconductor switching element and a parallel diode in half-bridges of power converters. In principle, the method can comprise any of the steps already described above in connection with FIGS. 1-3. Analogously, the apparatus described above can also comprise any desired components that are necessary for implementing the method described hereinafter.

In step 100, an electrical voltage is detected across a semiconductor switching element S1 to S6 as well as a diode D arranged parallel thereto. Furthermore, an output signal corresponding to this detected voltage is provided.

Then, in a step 200, an electric current is detected through the diode D. The detection of this current is done using the output signal provided in step 100 and the comparison to a threshold value. The current is only detected by the diode D when the switching element S1 to S6 arranged parallel to diode D is opened, for example in a free-wheel mode. Outside of these time periods, either the output value of the circuit arrangement 21 or the output value of the detection circuit 22 is ignored or overwritten (blanking).

If a current flow through the diode D is detected in step 200, a suitable reaction can be initiated in a further step. This can be, for example, the placing of an active short circuit as described above. If the corresponding switching elements are closed for this purpose, then the monitoring of the diode flow is terminated and starts again as soon as the active short circuit is ended and the switching elements are opened again.

In summary, the present invention relates to the detection of an electric current through a diode arranged parallel to a semiconductor switching element. For this purpose, an output signal of a circuit arrangement for saturation monitoring (desat circuit) is used. The output signal is evaluated at periods in which the semiconductor switching element is opened.

The invention claimed is:

1. An apparatus for detecting an electric current through a diode (D), wherein the diode (D) is arranged parallel to a semiconductor switching element (S1-S6) of a half-bridge, and wherein the apparatus comprises:

a circuit arrangement (21) for saturation monitoring of the semiconductor switching element (S1-S6), configured to detect an electrical voltage across the semiconductor switching element (S1-S6) and the diode (D) arranged parallel thereto, and to provide an output signal corresponding to the detected voltage, wherein the circuit arrangement (21) is configured as a DESAT circuit that simulates the electrical voltage across the semiconductor switching element (S1-S6), the electric voltage being limited to an amount of a supply voltage; and a detection device (22) configured to detect an electric current through the diode (D) using the output signal from the circuit arrangement (21) for saturation monitoring when the semiconductor switching element (S1-S6) of the half-bridge arranged parallel to the diode is opened.

2. The apparatus according to claim 1, wherein the circuit arrangement (21) comprises a comparator for saturation monitoring of the semiconductor switching element (S1-S6), being configured so as to compare the output signal from the circuit arrangement (21) for saturation monitoring to a predetermined reference voltage and to detect an electric current through the diode (D) if the output signal from the circuit arrangement (21) falls below the predetermined reference voltage for saturation monitoring.

3. The apparatus according to claim 1, wherein the detection device (22) comprises an analog-to-digital converter configured to determine a digital value corresponding to a voltage value of the output signal from the circuit arrangement (21) for saturation monitoring, wherein the detection device (22) is configured to detect an electric current through the diode (D) using the determined digital value.

4. The apparatus according to claim 1, having a monitoring device (11) configured so as to perform monitoring of the semiconductor switching element (S1-S6) using the output signal from the circuit arrangement (21) for saturation monitoring when the semiconductor switching element (S1-S6) is actuated in a conductive state.

5. The apparatus according to claim 4, wherein the detection device (22) and the monitoring device (11) are implemented in a common integrated circuit.

6. The apparatus according to claim 1, wherein the detection device (22) is configured so as to detect an electric current through the diode (D) in a first operating mode and to monitor the semiconductor switch (S1-S6) using the output signal from the circuit arrangement (21) for saturation monitoring in a second operating mode when the semiconductor switching element (S1-S6) is actuated in a conductive state.

7. The apparatus according to claim 1, wherein the half-bridge is arranged with the switching elements (S1-S6) and the diodes (D) in an electric power converter (1), and the detection device (22) is configured to detect an electric current through the diode (D) if, in the power converter (1) with the half-bridge, an operating state is set in which both switching elements (S1-S6) of the half-bridge are permanently opened.

8. An electrical drive system, having an electric machine (2); and a power converter (1) electrically coupled to the electric machine (2) and comprising at least one half-bridge, wherein each of the half-bridges comprises two semiconductor switching elements (S1-S6), each having a diode (D) arranged parallel to a semiconductor switching element (S1-S6), and wherein the power converter (1) is configured so as to drive the electric machine (2) using a DC voltage supplied to the power converter (1);

wherein an apparatus for detecting an electric current according to claim 1 is provided in the power converter (1) for each semiconductor switching element (S1-S6).

9. The electrical drive system according to claim 8, wherein the power converter (1) is configured to change from a switching state of freewheeling into an active short circuit if a current through a diode (D) has been detected in the apparatus for detecting an electric current.

10. The apparatus of claim 1, wherein the circuit arrangement (21) for saturation monitoring comprises a capacitor (C1), a diode (D1), and two resistors (R1, R2), wherein a first resistor (R1) of the two resistors (R1, R2) is arranged between the supply voltage (V) and a node (E), the capacitor (C1) is placed between the node (E) and a reference potential, and a series circuit consisting of a second resistor (R2) of the two resistors (R1, R2) and the diode (D1) is provided between the node (E) and an electrical connection to a phase terminal of the semiconductor switching element.

11. The apparatus of claim 10, wherein the series circuit consisting of the second resistor (R2) and the diode (D1) is provided between the node (E) and an electrical connection to a phase terminal of the semiconductor switching element to be monitored, and wherein the output signal present at the node (E) is provided to the detection device (22).

12. A method for detecting an electric current through a diode (D), wherein the diode (D) is arranged parallel to a semiconductor switching element (S1-S6) in a half-bridge, the method comprising:

detecting (100) an electrical voltage across the semiconductor switching element (S1-S6) and the diode (D) arranged parallel thereto by means of a circuit arrangement (21) for saturation monitoring of the semiconductor switching element (S1-S6) and providing an output signal corresponding to the detected voltage, wherein the detected voltage across the semiconductor switch element (S1-S6) is simulated by a circuit arrangement (21) configured as a DESAT circuit, the electric voltage being limited to an amount of a supply voltage; and detecting (200) an electric current through the diode (D) using the provided output signal when the semiconductor switching element (S1-S6) of the half-bridge arranged parallel to the diode (D) is opened.

* * * * *